(12) United States Patent
Tavakkoli Kermani Ghariehali et al.

(10) Patent No.: US 11,429,022 B2
(45) Date of Patent: Aug. 30, 2022

(54) SYSTEMS AND METHODS FOR CURING A SHAPED FILM

(71) Applicant: CANON KABUSHIKI KAISHA, Tokyo (JP)

(72) Inventors: Amir Tavakkoli Kermani Ghariehali, Austin, TX (US); Edward Brian Fletcher, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 294 days.

(21) Appl. No.: 16/661,461

(22) Filed: Oct. 23, 2019

(65) Prior Publication Data

US 2021/0124260 A1    Apr. 29, 2021

(51) Int. Cl.
| | | |
|---|---|---|
| *B29C 59/02* | (2006.01) | |
| *G03F 7/00* | (2006.01) | |
| *B29C 35/08* | (2006.01) | |
| *B29C 43/02* | (2006.01) | |
| *G03F 7/20* | (2006.01) | |
| *G03F 9/00* | (2006.01) | |

(Continued)

(52) U.S. Cl.
CPC ........ *G03F 7/0002* (2013.01); *B29C 35/0805* (2013.01); *B29C 43/021* (2013.01); *B29C 59/02* (2013.01); *G03F 7/0035* (2013.01); *G03F 7/2022* (2013.01); *G03F 9/7042* (2013.01); *B29C 2035/0833* (2013.01); *B29C 2043/025* (2013.01); *B29C 2059/023* (2013.01); *B82Y 40/00* (2013.01)

(58) Field of Classification Search
CPC ... G03F 7/0002; G03F 9/7042; B29C 59/022; B29C 2059/023
See application file for complete search history.

(56) References Cited

U.S. PATENT DOCUMENTS

| | | |
|---|---|---|
| 6,936,194 B2 | 8/2005 | Watts |
| 7,157,036 B2 | 1/2007 | Choi et al. |

(Continued)

OTHER PUBLICATIONS

Neitao Jiang, Yucheng Ding, Hongzhong Liu, Bingheng Lu, Yongsheng Shi, Jinyou Shao, Lei Yin, Two-Step Curing Method for Demoulding in UV Nanoimprint Lithography, Microelectronic Engineering, Sep. 7, 2007, 85(2)1458-164, Elsevier B.V., Amsterdam, NL, 2007.

(Continued)

*Primary Examiner* — Atul P. Khare
(74) *Attorney, Agent, or Firm* — Daneil Ratoff

(57) ABSTRACT

Systems and methods for shaping a film. Formable material in an imprint field on the substrate may be contacted with a shaping surface of a template. Outer boundaries of the imprint field correspond to outer boundaries of the shaping surface. Shaping the film includes forming a cured layer within the imprint field while the shaping surface is in contact with the formable material. Shaping the film may include separating the shaping surface from the cured layer. Shaping the film may include moving the template away from the imprint field to a first offset location wherein the outer boundaries of the shaping surface are offset relative to the outer boundaries of the imprint field. Shaping the film may include curing a second portion of the formable material while the template is at the first offset location so as to form the shaped film.

18 Claims, 12 Drawing Sheets

(51) Int. Cl.
  *B82Y 30/00* (2011.01)
  *B82Y 40/00* (2011.01)

(56) References Cited

U.S. PATENT DOCUMENTS

| | | | |
|---|---|---|---|
| 8,066,930 | B2 | 11/2011 | Sreenivasan et al. |
| 8,076,386 | B2 | 12/2011 | Xu et al. |
| 8,349,241 | B2 | 1/2013 | Sreenivasan et al. |
| 8,361,371 | B2 | 1/2013 | Khusnatdinov et al. |
| 8,480,946 | B2 * | 7/2013 | Mikami ............... B82Y 10/00 264/494 |
| 9,205,594 | B2 * | 12/2015 | Ermochkine .......... B82Y 40/00 |
| 10,052,798 | B2 * | 8/2018 | Miyazawa .......... B29C 35/0888 |
| 11,199,772 | B2 * | 12/2021 | McMackin ........... B82Y 10/00 |
| 2005/0005801 | A1 * | 1/2005 | Thallner ........... H01L 21/31105 257/E21.026 |
| 2010/0096764 | A1 | 4/2010 | Lu et al. |
| 2015/0306792 | A1 | 10/2015 | Miyazawa |
| 2017/0157836 | A1 * | 6/2017 | Miyazawa ............. B29C 59/02 |
| 2019/0101823 | A1 | 4/2019 | Patel et al. |
| 2019/0179228 | A1 | 6/2019 | Khusnatdinov et al. |
| 2021/0181624 | A1 * | 6/2021 | Shudo ................. G03F 7/0002 |

OTHER PUBLICATIONS

Hongzhong Liu, Weitao Jiang, Yucheng Ding, Yiping Tang, Bingheng Lu, Hongbo Lan, Yongsheng Shi, Lei Yin, A Novel Loading and Demoulding Process Control in UV Nanoimprint Lithography, Sep. 12, 2008, 86(1):4-9, Elsevier B.V., Amsterdam, NL, 2008.

Amir Tavakkoli Kermani Ghariehali et al., U.S. Appl. No. 16/428,166, Frame Curing Method for Extrusion Control, filed May 31, 2019.

Alborz Amirsadeghi, Developing Defect-Tolerant Demolding Process in Nanoimprint Lithography, LSU Doctoral Dissertation, Louisiana State University and Agricultural and Mechanical College, Baton Rouge, LA, 2013.

Jian Chen, Zheng Chen, Hongye Su, Jian Chu, Two-step Method for Gross Error Detection in Process Data, Proceedings of the 2001 American Control Conference, Arlington, VA Jun. 25-27, 2001, pp. 2121-2126, American Automatic Control Council, Danvers, MA, 2001.

S. Johnson, R. Burns, E. K. Kim, M. Dickey, G. Schmid, J. Meiring, S. Burns, C. G. Willson, D. Convey, Y. Wei, P. Fejes, K. Gehoski, D. Mancini, K. Nordquist, W. J. Dauksher, D. J. Resnick, Effects of Etch Barrier Densification on Step and Flash Imprint Lithography, Journal of Vacuum Science and Technology B, Nov. 29, 2005,23(6):2553-2556, American Vacuum Society, 2005.

* cited by examiner

SYSTEMS AND METHODS FOR CURING A SHAPED FILM

BACKGROUND OF INVENTION

Technical Field

The present disclosure relates to systems and methods for curing an imprinted film.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable or curable) layer. The shape of this film may then be used to transfer a pattern corresponding to the relief pattern into and/or onto an underlying substrate.

The shaping process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY OF THE INVENTION

A first embodiment, may be a method of shaping a film on a substrate. The method of shaping the film may comprise a plurality of steps. The method of shaping the film may include a step (a) of contacting formable material in a first imprint field on the substrate with a shaping surface of a template. Outer boundaries of the first imprint field may correspond to outer boundaries of the shaping surface while the shaping surface is in contact with the formable material. The method of shaping the film may include a step (b) of forming a cured layer within the first imprint field while the shaping surface is in contact with the formable material by curing a first portion of the formable material. The method of shaping the film may include a step (c) of separating the shaping surface from the cured layer. The method of shaping the film may include a step (d) of moving the template away from the first imprint field to a first offset location wherein the outer boundaries of the shaping surface are offset relative to the outer boundaries of the first imprint field. The method of shaping the film may include a step (e) of curing a second portion of the formable material while the template is at the first offset location so as to form the shaped film.

The first embodiment, may be a method of manufacturing articles including the use of the method of shaping the film. The method of manufacturing articles may further comprise processing the substrate on which the shaped film is produced so as to manufacture the articles.

The first embodiment, may further comprise repeating steps (a)-(e) at a second imprint field. During steps (d-e) the template may be at a second offset location instead of the first offset location. A first vector quantity may represent a relative difference between the first imprint field and the first offset location, projected onto a plane parallel to the imprint field. A second vector quantity may represent a relative difference between the second imprint field and the second offset location, projected onto a plane parallel to the imprint field. The first vector quantity may be different from the second vector quantity.

In an aspect of the first embodiment, the substrate includes only one imprint field.

The first embodiment, may further comprise repeating steps (a)-(e) for each imprint field among a plurality of imprint fields on the substrate. During steps (d-e) the template may be at a different offset location for each imprint field. There may be a set of vector quantities. Each vector quantity in the set of vector quantities may represent a relative difference between a particular imprint field among the plurality of imprint fields and a particular offset location associated with the particular imprint field, projected onto a plane parallel to the imprint field. There may be at least two different vector quantities in the set of vector quantities.

In an aspect of the first embodiment, all the vector quantities in the set of vector quantities are different from each other.

In an aspect of the first embodiment, magnitudes of the vector quantities in the set of vectors may be less than a diagonal size of the imprint field.

In an aspect of the first embodiment, magnitudes of the vector quantities in the set of vectors may be less than 2 mm.

In an aspect of the first embodiment, the cured layer may be formed in step (b) by exposing the first portion of the formable material to actinic radiation while the template is in contact with formable material.

In an aspect of the first embodiment, a PNF of the actinic radiation incident on a perimeter portion of the formable material at the outer boundaries of the first imprint field may be less than a hard cure PNF threshold of the formable material and greater than a soft cure PNF threshold of the formable material.

In an aspect of the first embodiment, a central portion of the formable material that has been cured with a PNF of actinic radiation above the hard cure PNF threshold may have a shrinkage of less than 10%. Formable material that has been cured with a PNF that is between the hard cure PNF threshold and the soft cure PNF threshold may have a shrinkage of between 11-20%.

In an aspect of the first embodiment, a central PNF of the actinic radiation incident on the formable material in a central portion of the first imprint field may be greater than the hard cure PNF threshold of the formable material.

In an aspect of the first embodiment, curing the second portion of the formable material in step (e) may be performed by exposing the second portion of the formable material to actinic radiation while the template is not in contact with formable material.

In an aspect of the first embodiment, all or a portion of the actinic radiation that exposes the second portion of the formable material in step (e) passes through one or more of: the shaping surface of the template; mesa sidewalls of the template; and a recessed surface of the template.

In an aspect of the first embodiment, a PNF in step (e) of the actinic radiation incident on a perimeter portion of the formable material at the outer boundaries of the first imprint field may be less than a PNF incident on a central portion of the formable material.

In an aspect of the first embodiment, a total PNF from steps (b) and (e) of the actinic radiation incident on a perimeter portion of the formable material at the outer boundaries of the first imprint field may be greater than or equal to a hard cure PNF threshold of the formable material.

In an aspect of the first embodiment, the cured layer may be formed in step (b) by exposing the first portion of the formable material to a first wavelength distribution of actinic radiation while the template is in contact with formable material. Curing the second portion of the formable material in step (e) may be performed by exposing the second portion of the formable material to a second wavelength distribution of actinic radiation while the template is not in contact with formable material. The first wavelength distribution is different from the second wavelength distribution of actinic radiation.

In an aspect of the first embodiment, an effective PNF from steps (b) and (e) of the actinic radiation incident on a perimeter portion of the formable material at the outer boundaries of the first imprint field is greater than or equal to a hard cure PNF threshold of the formable material.

The second embodiment, may be a shaping system. The shaping system may comprise: a substrate chuck configured to hold a substrate; a template chuck configured to hold a template; a positioning system configured to position the template and the substrate relative to each other; and a radiation source. The positioning system may be configured to contact formable material in a first imprint field on the substrate with a shaping surface of the template. Outer boundaries of the first imprint field may correspond to outer boundaries of the shaping surface while the shaping surface is in contact with the formable material. The radiation source may be configured to form a cured layer within the first imprint field while the shaping surface is in contact with the formable material by curing a first portion of the formable material. The positioning system may be configured to separate the shaping surface from the cured layer. The positioning system may be configured to move the template away from the first imprint field to a first offset location wherein the outer boundaries of the shaping surface are offset relative to the outer boundaries of the first imprint field. The radiation source may be configured to cure a second portion of the formable material while the template is at the first offset location to form the shaped film.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
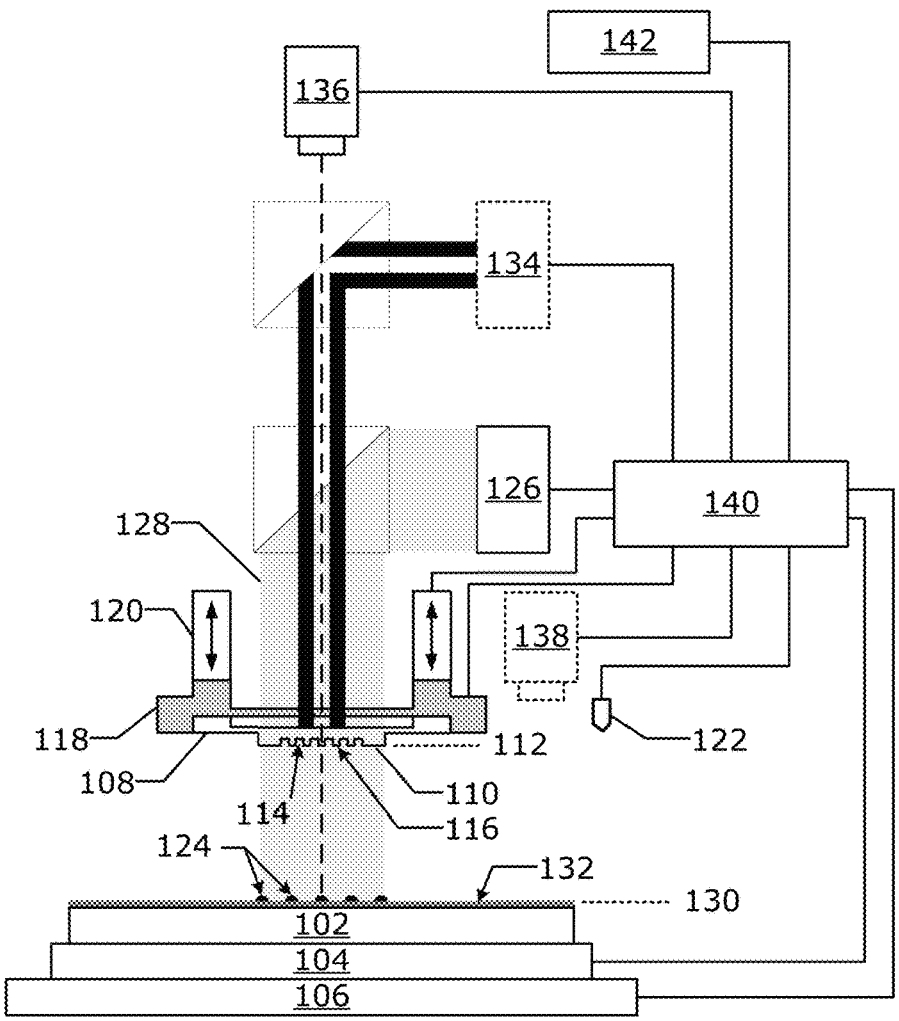
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprinting lithography technique can be used to shape a film on a substrate from a formable material. The shaping process includes bringing a template into contact with the formable material. The template may include a shaping surface on a mesa that extends above a recessed surface. The template may also include mesa sidewalls that surround the mesa and connect the mesa to the recessed surface. During the shaping process the formable material spreads due to capillary action and other forces such that the formable material spreads toward the mesa sidewalls. Extrusion defects may form when formable material wets the mesa sidewalls during the shaping process After the formable material is exposed to actinic radiation, and the template separates from the formable material, one or more extrusion defects may also be cured by the actinic radiation and may stay on the substrate and/or template.

When the template is separated from the cured formable material an extrusion may be divided into two parts with one part remaining on the substrate and the other part staying attached to the mesa sidewall.

The applicant has found that by optimizing one or more imprint parameters, such as drop pattern and other imprint parameters, the volume of the extrusion which remains on the substrate is acceptable within acceptable tolerances and does not substantially impact yield of articles from the substrate.

After many imprints extrusions accumulate on the mesa sidewalls. Formable material accumulation on the mesa sidewall is subjected to repeated exposure to actinic radiation. The accumulated extrusions may then be released onto the substrate and can form substrate extrusions which are large enough to impact the yield of articles.

The applicant has determined that it is possible to mitigate the accumulation of extrusions on the mesa sidewall by controlling an amount of actinic radiation that is incident on the mesa sidewalls. The applicant has found that it is useful to describe the amount of actinic radiation using units which we refer to here as polymerization factor (PNF). PNF is the square root of the intensity (I) of the actinic radiation received by the formable material multiplied by the amount of time (t) that the formable material receives the actinic radiation ($\sqrt{I} \cdot t (W_{0.5} \cdot cm^{-1} \cdot s)$). The square root of the intensity is proportional to the electric field intensity experienced by the formable material. The applicant has found that this electric field intensity integrated over the exposure time is a useful parameter for understanding the curing by polymerization of a formable material while it is exposed to actinic radiation and sandwiched between to surfaces.

The applicant has also found that it can be challenging to control the PNF of actinic radiation on the mesa sidewalls to prevent curing the template extrusions while also curing the formable material under the template and adjacent to the mesa sidewalls.

The applicant has found that the formable material near the mesa sidewalls needs to receive a high enough PNF so as to cure the patterned area adequately. If the patterned area does not receive a high enough PNF then defectivity will rise and yield will go down. What is needed is a method of curing the formable material that produces a high quality shaped film while also reducing the amount actinic radiation that is incident on the sidewalls of the template.

Nanoimprint System (Shaping System)

FIG. 1 is an illustration of a nanoimprint lithography system 100 in which an embodiment may be implemented. The nanoimprint lithography system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a shaping surface 112 thereon also on the front side of the template 108. The shaping surface 112, also known as a shaping surface, is the surface of the template that shapes the formable material 124. In an embodiment, the shaping surface 112 is planar and is used to planarize the formable material. Alternatively, the template 108 may be formed without the mesa 110, in which case the surface of the template facing the substrate 102 is equivalent to the mold 110 and the shaping surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The shaping surface 112 may have features defined by a plurality of spaced-apart template recesses 114 and/or template protrusions 116. The shaping surface 112 defines a pattern that forms the basis of a pattern to be formed on the substrate 102. In an alternative embodiment, the shaping surface 112 is featureless in which case a planar surface is formed on the substrate. In an alternative embodiment, the shaping surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., a curable material or a polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a curing system that includes at least a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124. The radiation source 126 may include one or more radiation sources. The radiation source 126 may include and/or may be optically connected to a plurality optical of components that guide, filter, and shape the actinic radiation that is incident on the formable material 124. The plurality optical of components may include but are not limited to one or more of: lenses; mirrors; filters; apertures; SLMs; adaptive optics; beam splitters; beam combiners; prisms; etc. In an embodiment, curing the formable material includes changing the liquid formable material into a solid material. There are many methods of changing a liquid formable material into a sold material. For example, one or more of the following non limiting list of reactions and operations may be used separately or in combination to change the physical state of the formable material: free-radical polymerization, anionic polymerization, cationic polymerization, decomposition reaction, catalyzed reaction, irradiation, baking, chilling, etc.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting process. The field camera 136 may also be configured to measure interference fringes, which change as the formable material spreads 124 between the gap between the shaping surface 112 and the substrate surface 130.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the shaping surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatio-temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the shaping surface 112, defining a patterned layer on the substrate 102. The formable material 124 is cured while the template 108 is in contact with formable material 124, forming the patterned layer on the substrate 102. Thus, the nanoimprint lithography system 100 uses an imprinting process to form the patterned layer which has recesses and protrusions which are an inverse of the pattern in the shaping surface 112. In an alternative embodiment, the nanoimprint lithography system 100 uses an imprinting process to form a planar layer with a featureless shaping surface 112.

The imprinting process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the shaping surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the shaping surface 112 in each imprint field. The patterned layer may also include one or more features such as protrusions which extend above the residual layer having a thickness. These protrusions match the recesses 114 in the mesa 110.

Template

Figure 2:
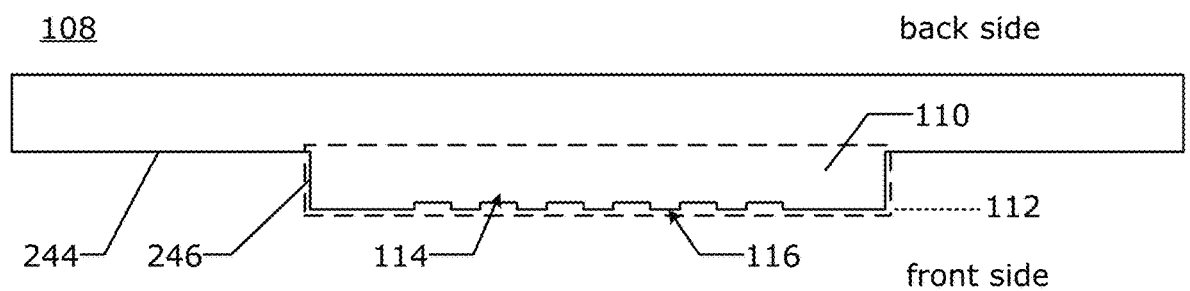
FIG. 2 is an illustration of an exemplary template that may be used in an embodiment.

FIG. 2 is an illustration of a template 108 that may be used in an embodiment. The shaping surface 112 may be on a mesa 110 (identified by the dashed box in FIG. 2). The mesa 110 is surrounded by a recessed surface 244 on the front side of the template. Mesa sidewalls 246 connect the recessed surface 244 to shaping surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

Imprinting Process

Figure 3:
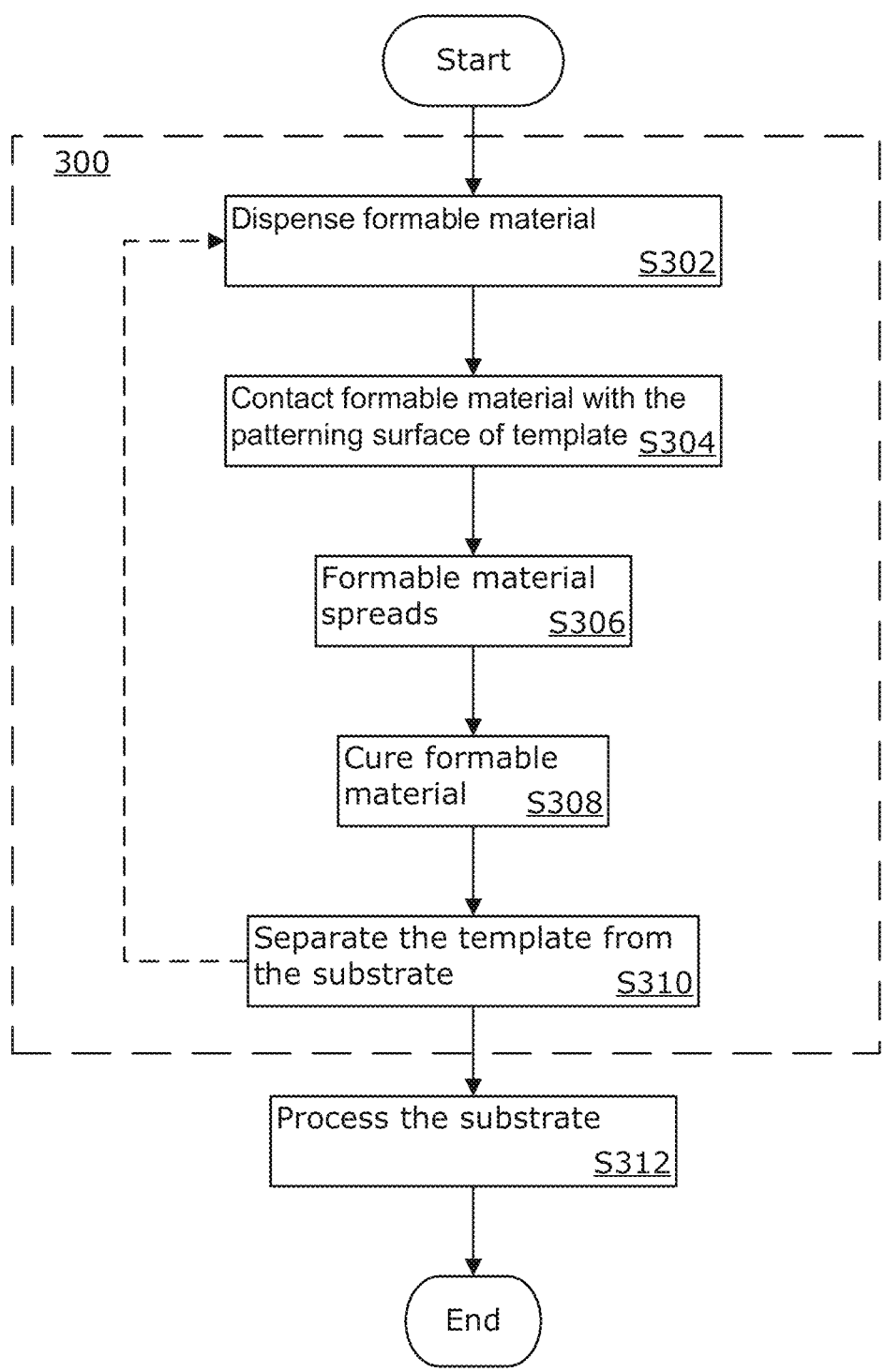
FIG. 3 is a flowchart illustrating an exemplary imprinting method as used in an embodiment.

FIG. 3 is a flowchart of a method of manufacturing an article (device) that includes an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control the imprinting process 300.

In an alternative embodiment, the imprinting process 300 is used to planarize the substrate 102. In which case, the shaping surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by an index i. In which N is a real integer such as 1, 10, 75, etc. $\{N \in \mathbb{Z}^+\}$. In a dispensing step S302, the processor 140 may cause the fluid dispenser 122 to dispense formable material onto an imprinting field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the shaping surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the shaping surface 112. The curing illumination pattern provides enough energy to cure (for example by polymerizing) the formable material 124 under the shaping surface 112.

In a separation step S310, the processor 140 uses one or more of the substrate chuck 104, the substrate positioning stage 106, template chuck 118, and the imprint head 120 to separate the shaping surface 112 of the template 108 from the cured formable material on the substrate 102. If there are additional imprint fields to be imprinted, then the process moves back to step S302.

In an embodiment, after the imprinting process 300 is finished additional semiconductor manufacturing processing is performed on the substrate 102 in a processing step S312 so as to create an article of manufacture (e.g. semiconductor device). In an embodiment, each imprint field includes a plurality of devices.

The further semiconductor manufacturing processing in processing step S312 may include etching processes to transfer a relief image into the substrate that corresponds to the pattern in the patterned layer or an inverse of that pattern. The further processing in processing step S312 may also include known steps and processes for article fabrication, including, for example, inspection, curing, oxidation, layer formation, deposition, doping, planarization, etching, formable material removal, dicing, bonding, packaging, and the like. The substrate 102 may be processed to produce a plurality of articles (devices).

Extrusions

Figure 4:
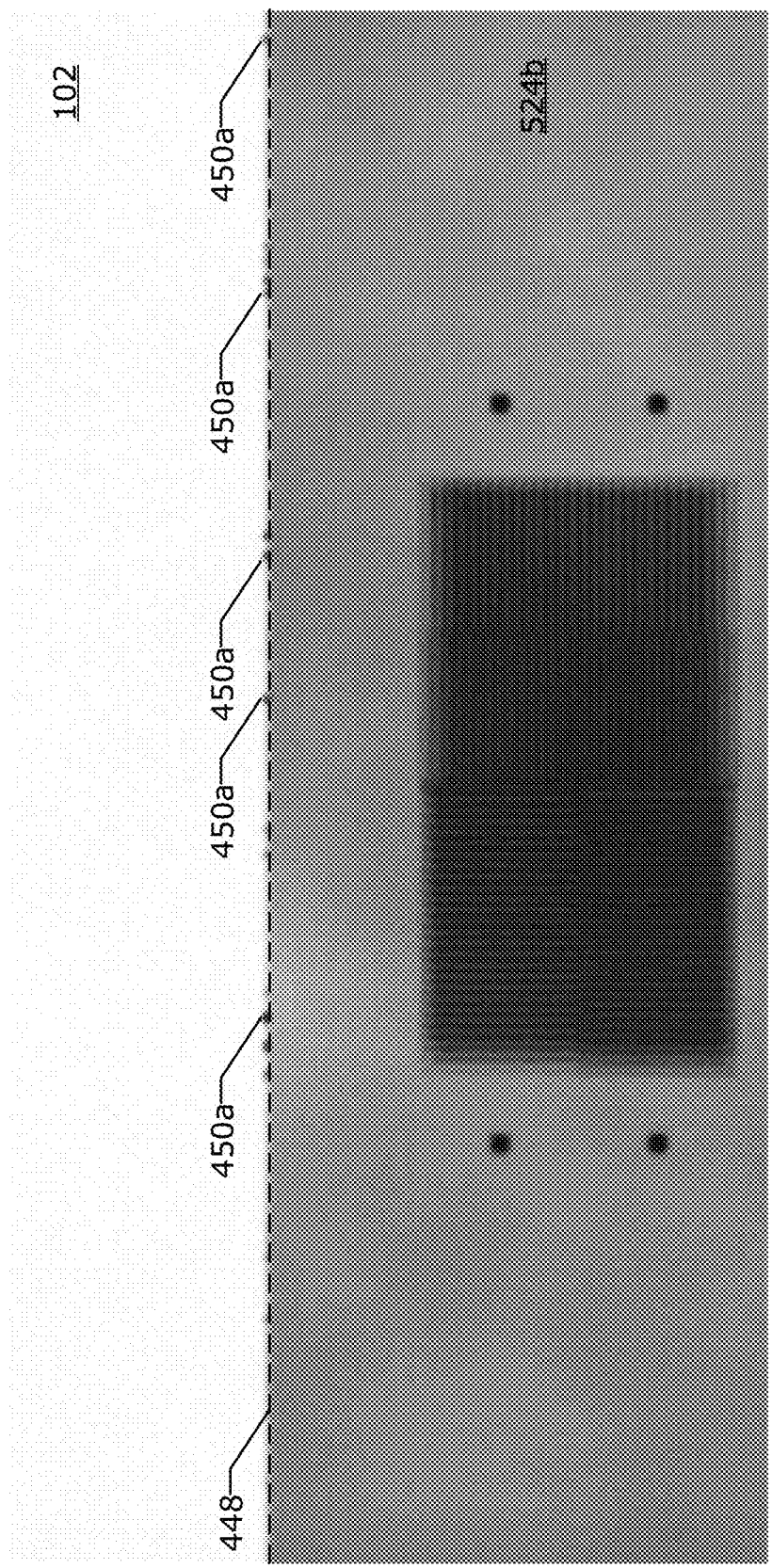
FIG. 4 is a micrograph of an imprint field edge showing extrusions on the substrate.

During the imprinting process 300, a single template 108 may be used to imprint a plurality of imprint fields over a plurality of substrates 102 (wafers) in a step and repeat process. During the imprinting process 300, the mesa sidewalls 246 are aligned with the imprint field edges 448 (dashed line). During the imprinting process 300, formable material 124 may form substrate extrusions 450a at the imprint field edge 448 on the substrate as illustrated by the micrograph in FIG. 4. The applicant has determined that these substrate extrusions 450a may start out as template extrusions 550b (see FIG. 5D and description below) on the mesa sidewalls 246. These template extrusions 550b on the mesa sidewalls 246 accumulate via one or both of seepage and vapor deposition. Over time these template extrusions 550b (FIG. 5D) can grow and may eventually fall off and/or separate from the template, forming defects on the substrate 102 such as substrate extrusions 450a. These template extrusions 550b are formable material 124 that contaminate the mesa sidewalls 246. This tends to be a statistical process that starts at different times and positions on the mesa sidewalls 246 as the template is repeatedly used in the imprinting process 300 on one or more device yielding substrates 102.

Figure 5A:
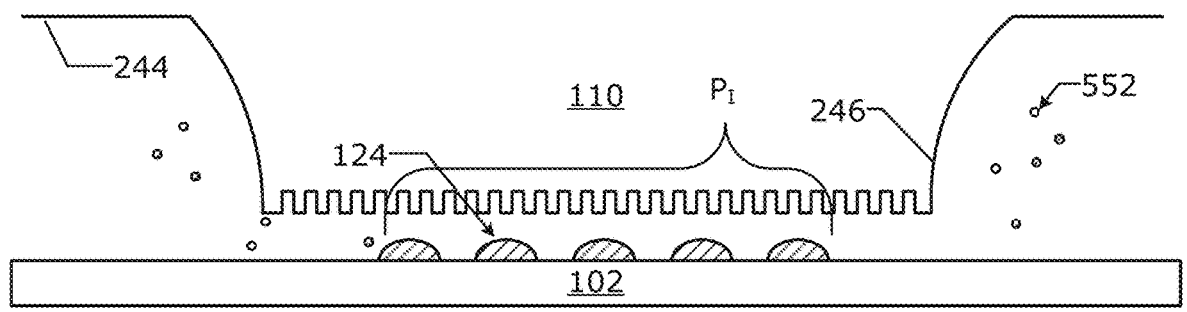
FIGS. 5A-D are illustrations of the shaping of formable material with extrusions.
Figure 5B:
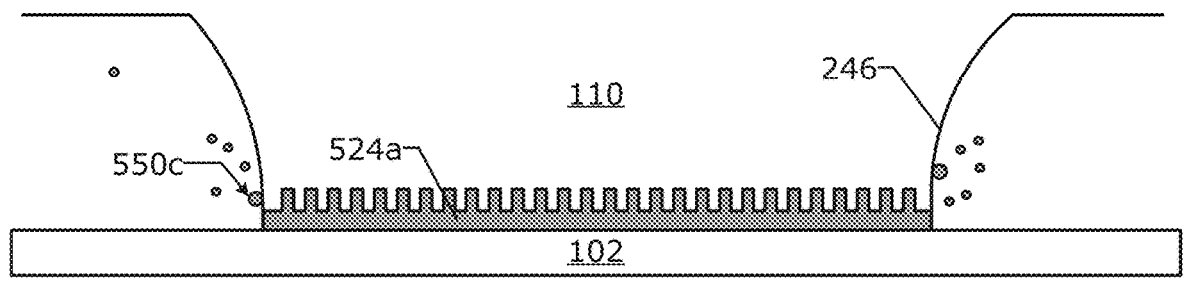

FIG. 5A is an illustration of a mesa 110 as it is about to come into contact with droplets of the formable material 124 on a substrate 102. The formable material 124 may have a vapor pressure which produces vapor 552. Over time the vapor 552 may deposit onto the mesa sidewalls 246, as illustrated in FIG. 5B, and eventually form a coating on the mesa sidewalls 246 of uncured formable material. FIG. 5B also illustrates the formation of a liquid layer 524a between the mesa 110 and the substrate 102. The imprinting drop pattern $P_I$ positions droplets a sufficient distance from the mesa sidewalls 246, such that the formable material 124 may reach the imprint field edge 448 and minimizes an amount that does seep out and come into contact with the mesa sidewalls 246.

Figure 5C:
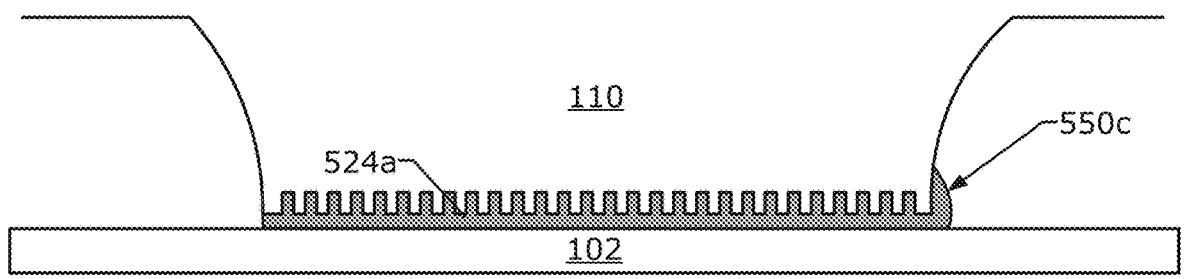
Figure 5D:
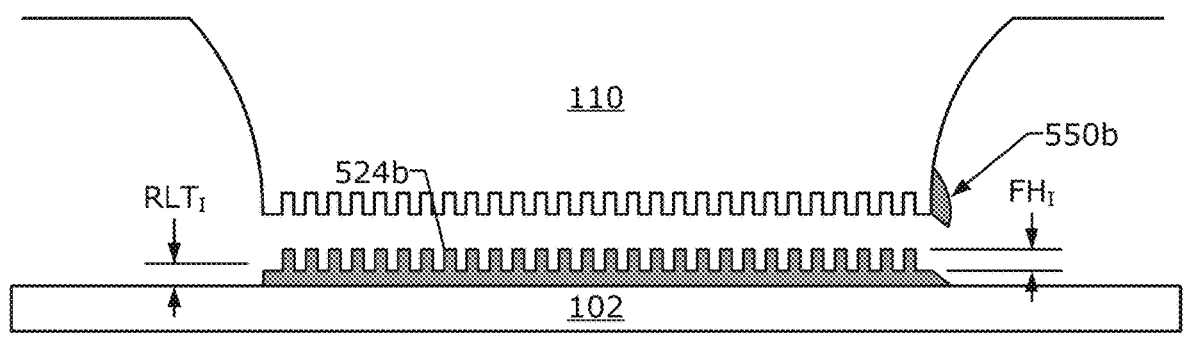

Even if the imprinting drop pattern $P_I$ is designed to eliminate the formation of substrate extrusions 450a, a small pre-cured template extrusion 550c may eventually form as illustrated in FIG. 5C. During the curing step S308 the liquid layer 524a is turned into a cured layer 524b. The cured layer 524b has a residual layer thickness $RLT_I$ and features having a feature height $FH_I$ as illustrated in FIG. 5D. Also, during the curing step S308 pre-cured template extrusions 550c may be solidified, forming a cured template extrusion 550b. During the separation step S310 the solidified small template extrusions 550b may stick to the mesa sidewall 246 as illustrated in FIG. 5D.

The applicant has found that template extrusions 550b and pre-cured template extrusions 550c on the mesa sidewalls 246 do not necessarily create defects on the substrate 102 that affect the final devices produced from the substrate 102. Although small template extrusions 550b near the intersection of the mesa sidewalls 246 and the shaping surface 112 can create seeds for large extrusions, which can create meaningful defects.

Imprinting Process as Used in an Embodiment

In an embodiment, the imprinting process described in FIG. 3 is modified so as to improve the quality of the shaped film. In an embodiment, a portion of the formable material in the patterned region is soft cured before template separation. In an embodiment, soft cured formable material has acceptable mechanical properties (such as storage modulus) to survive template separation, however soft cured formable material is not acceptable for downstream processes. For example, some of the soft cured formable material will evaporate. In addition, feature height and RLT of the soft cured formable material will shrink. This evaporation and shrinkage can have a negative impact on a process window for subsequent pattern transfer processes. Pattern transfer processes are those processes which transfer the pattern (or its negative) of the shaped film into the substrate. Furthermore, etch rate nonuniformity between hard cured areas and soft cured areas can reduce the pattern transfer process window.

In an embodiment, the applicant has found that acceptability of substrate extrusions depends on the subsequent process parameters and tends to have an extrusion width of less than 2 µm. An extrusion height of acceptable substrate extrusion should be less than 110% of the feature height of the template. The extrusion width is the width of the extrusion in the direction towards the neighboring imprint field facing the mesa sidewall on which the extrusion is attached. The length of the extrusion in the direction parallel to the mesa sidewall may be longer than 2 µm. In an embodiment, the extrusion width is less than or equal to half a distance between neighboring imprint fields. In an embodiment, the extrusion width is less than or equal to a distance between neighboring imprint fields. In an embodiment, an extrusion height may be much higher than the feature height and still be acceptable as long as it does not affect subsequent processes affecting the yield of the final product.

Figure 6:
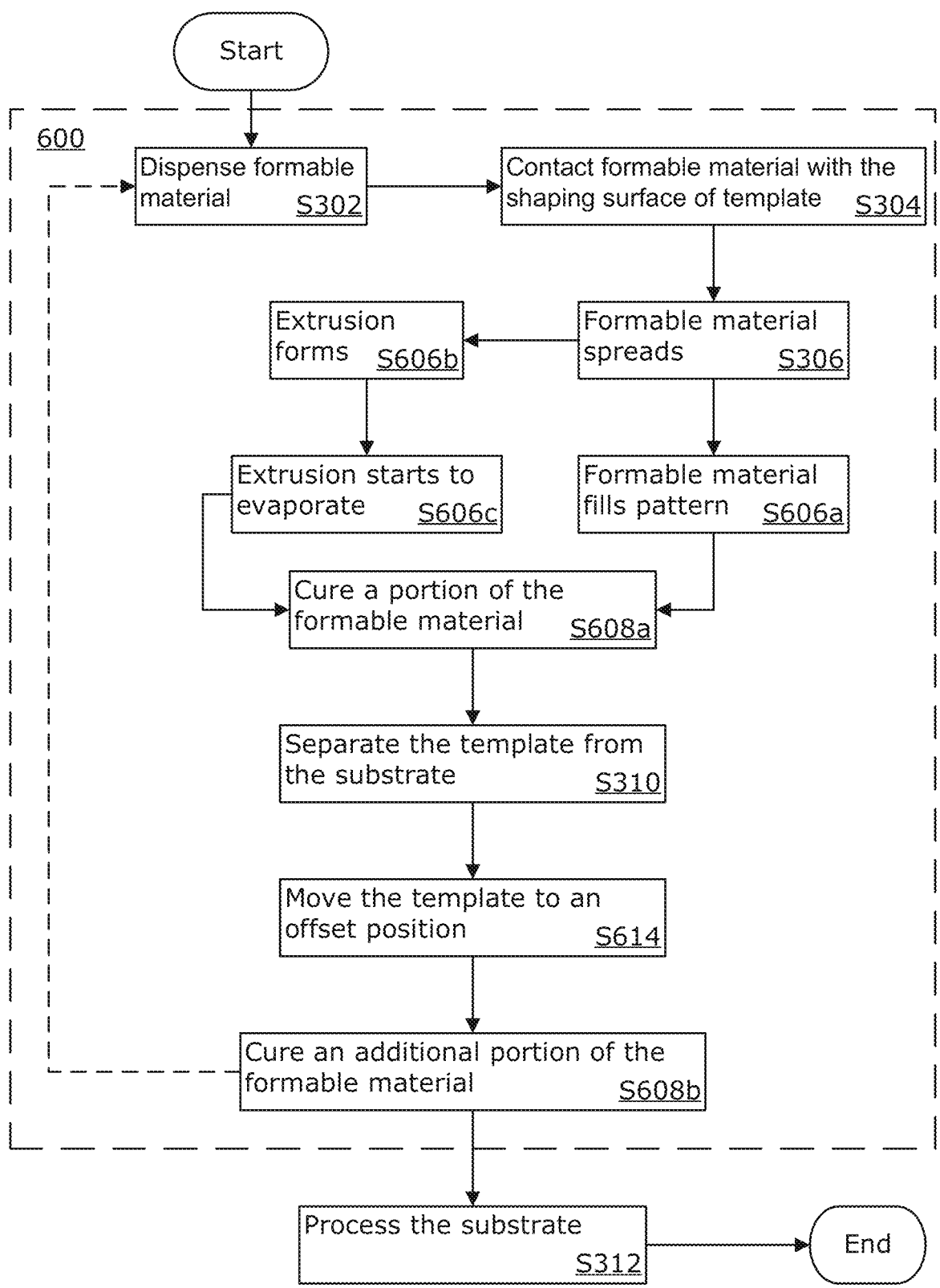
FIG. 6 is an illustration of a shaping process which may be used in an embodiment.

FIG. 6 is a flowchart of a method of manufacturing an article (device) that includes a shaping process 600 (substantially similar to the imprinting process 300) that may use the nanoimprint lithography system 100 to shape formable material 124 into a film in one or more imprint fields (also referred to as: pattern areas or shot areas) on a substrate 102. The shaping process 600 may include one or more of the steps described in the imprinting process 300 such as a template mounting step; a substrate mounting step; a positioning step; the dispensing step S302; a contacting step S304; a spreading step S306; etc.

The shaping process 600 may include the dispensing step S302. During the dispensing step S302, the droplets of the formable material 124 are dispensed in an imprinting drop pattern $P_I$ as illustrated in FIG. 5A. The imprinting drop pattern $P_I$ may be configured to allow some of the formable material 124 to extrude beyond the imprint field.

Figure 7A:
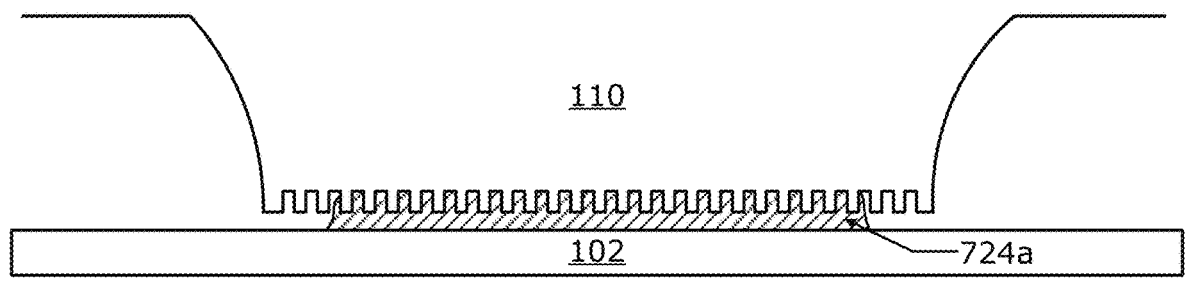
FIGS. 7A-I are illustrations about the shaping process as used in an embodiment.
Figure 7B:
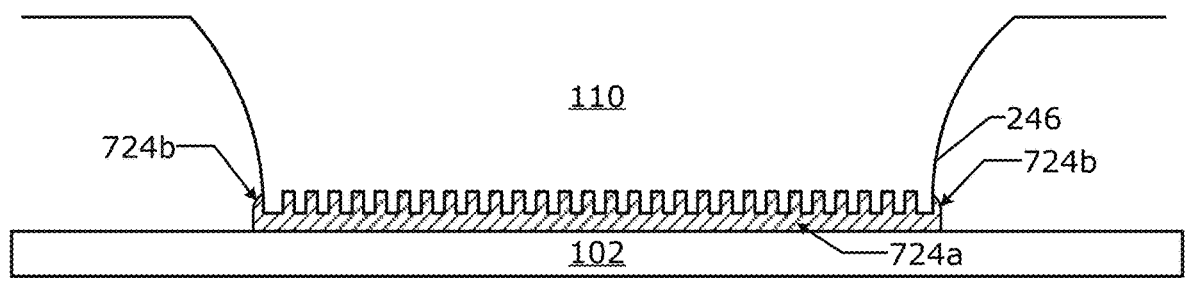

The shaping process 600 may include the contacting step S304 which causes the formable material 124 to form a film of uncured formable material 724a as illustrated in FIG. 7A. During the contacting step S304, the backpressure applied to the template 108 and the positioning speed may be configured to allow some of the film of uncured formable material 724a to extrude beyond the imprint field as illustrated in FIG. 7B forming uncured extrusions 724b.

The shaping process 600 may include the spreading step S306. During the spreading step S306 the formable material 124 fills the pattern in subprocess S606a (if the pattern exists) of the template 108. For featureless templates, subprocess S606a may include the spreading formable material 124 between the template 108 and the substrate 102. During the spreading step S306 the formable material 124 may spread beyond the mesa sidewalls forming uncured extrusions 724b in subprocess S606b as illustrated in FIG. 7B. During the spreading step S306, uncured extrusions 724b may evaporate in a subprocess S606c. The extent to which the uncured extrusions 724b evaporates, depends on the surface area of the extrusion that is exposed to local gaseous environment and the amount of time before the uncured extrusions 724b receives sufficient actinic radiation that prevents evaporation.

Figure 7C:
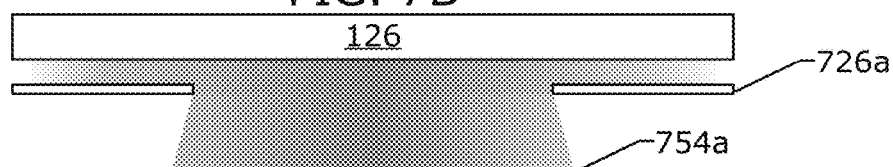
Figure 7C:
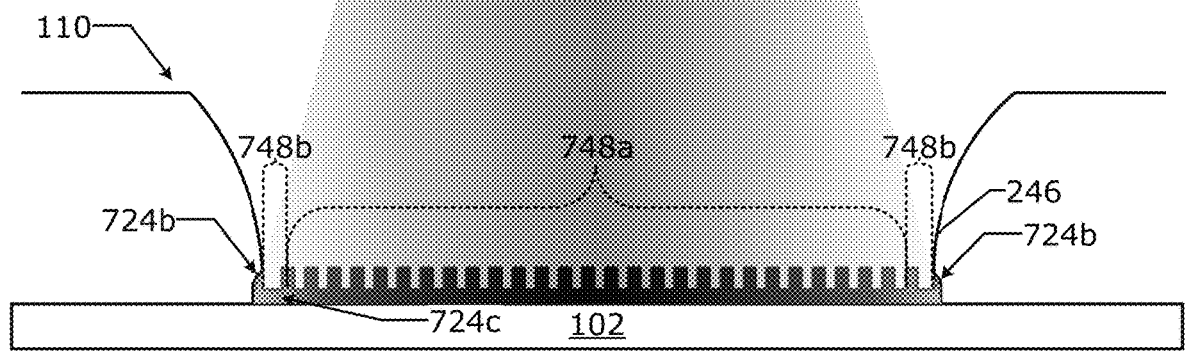
Figure 7D:
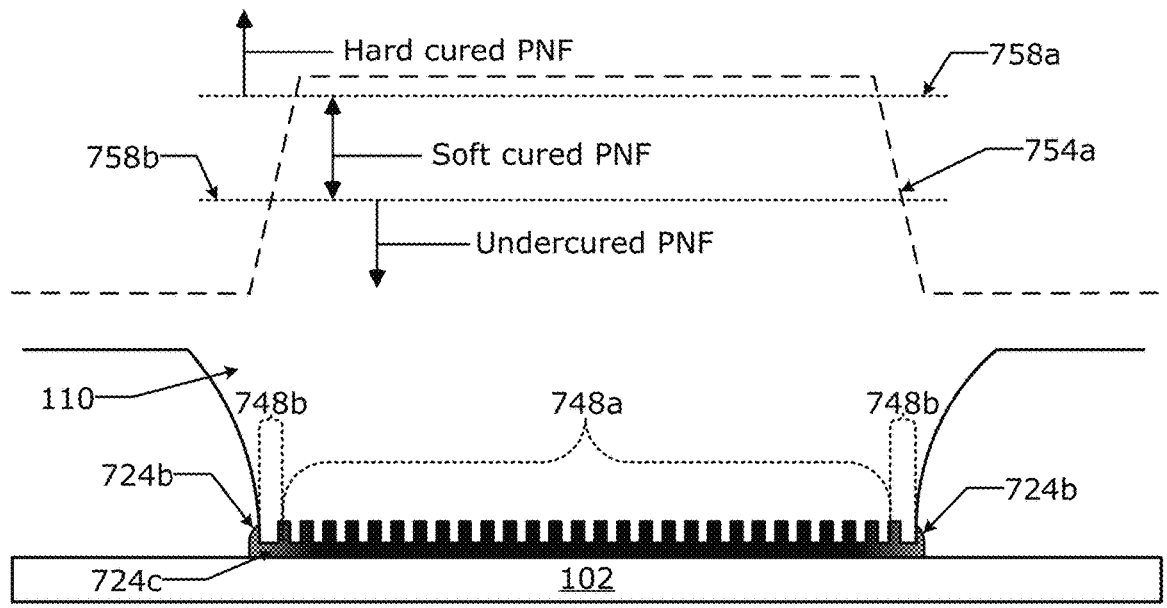

The shaping process 600 may include the first curing step S608a in which a cured layer is formed by curing a first portion of the formable material. In an embodiment, the processor 140 may send instructions to the radiation source 126 to send a first PNF pattern 754a of actinic radiation through the template 108, the mesa 110, and the shaping surface 112. The first PNF pattern 754a provides enough energy to soft cure a portion of the formable material 124 under the shaping surface 112. In an embodiment, the first PNF pattern 754a provides enough energy to hard cure a central portion 748a of the imprint field of the formable material and soft cure a perimeter portion 748b of the formable material as illustrated in FIG. 7C. In an embodiment, the first PNF pattern 754a is produced by sending actinic radiation from a radiation source 126 through an aperture 726a or a spatial light modulator (SLM). The SLM may be a digital micromirror device (DMD), Liquid Crystal on Silicon (LCoS), Liquid Crystal Device (LCD), etc. In an embodiment, the radiation source 126 includes or is connected to an aperture 726a or SLM as illustrated in FIG. 7C. The aperture 726a is adjusted such that the first PNF pattern 754a provides sufficient actinic radiation to soft cure the perimeter portion of the imprint field as illustrated in FIG. 7C. In an embodiment, the first PNF pattern 754a provides enough energy to hard cure a central portion 748a and soft cure a perimeter portion 748b and has a first PNF pattern cross section 754a as illustrated in FIG. 7D. In an embodiment, exposing the uncured formable material 724a under the shaping surface 112 to the first PNF pattern 754a produces a semi-cured film 724c. At least a portion of the semi-cured film 724c is soft cured by the first PNF pattern 754a. In an embodiment, a portion of the semi-cured film 724c is hard cured by the first PNF pattern 754a. The portion of the semi-cured film 724c that is soft cured has received a soft cured PNF of actinic radiation that is between a hard cure PNF threshold 758a and a soft cure PNF threshold 758b. In an embodiment, formable material 124 that is not under the shaping surface 112 may receive an undercured PNF of actinic radiation that is below a soft cure PNF threshold 728b. In an embodiment, a portion of the semi-cured film 724c that is hard cured has received a hard cured PNF of actinic radiation that is above the hard cure PNF threshold 758a.

Figure 7E:
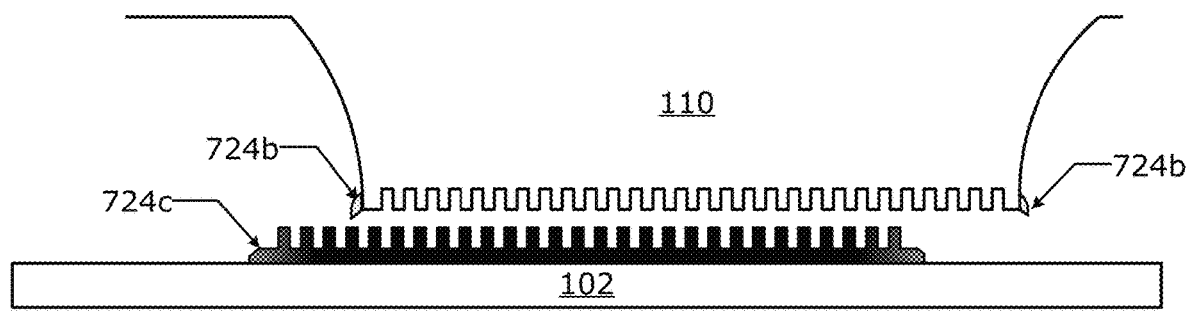

The shaping process 600 may include the separation step S310. During the separation step S310, the processor 140 uses one or more of the substrate chuck 104, the substrate positioning stage 106, template chuck 118, and the imprint head 120 to separate the shaping surface 112 of the template 108 from the semi-cured film 724c on the substrate 102. The separation step S310 may be configured to separate the semi-cured film 724c in which at least a portion of the formable material is soft cured without damaging the soft cured formable material. At the end of the separation step S310 the shaping surface 112 is a positioned above the semi-cured film 724c by at least the feature height of the shaping surface 112 as illustrated in FIG. 7E. In an embodiment, the shaping surface 112 is positioned 101%-500000% the thickness of the cured formable material above a crown surface of the cured formable material. In an embodiment, the shaping surface 112 is positioned 2 nm-5 mm above a crown surface of the cured formable material.

The shaping process 600 may include a translation step S614. During the translation step S614, the processor 140 may send instructions to one or more of the substrate chuck 104, the substrate positioning stage 106, template chuck 118, a template positioning stage, and the imprint head 120 to translate one or both of the template 108 and the substrate 102 to an offset position as illustrated in FIG. 7E. In an embodiment, the offset position is offset from the imprint field in both the x and y positions by 2 mm or less. In an embodiment, the offset position is determined by the limitations of the optical system that produces the second PNF pattern 754*b* described below.

Figure 7F:
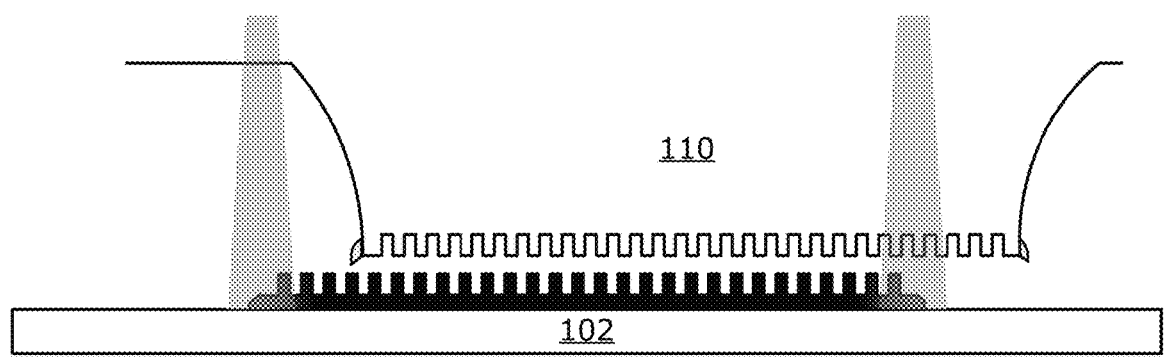

The shaping process 600 includes a second curing step S608*b*. During the second curing step S608*b*, the processor 140 may send second curing instructions to the nanoimprint lithography system 100 causing a second portion of the formable material to cure while the template is in the offset location due to the translation step S614. The second curing instructions may include instructions to one or more radiation sources to provide a second PNF pattern 754*b* to the second portion of the formable material as illustrated in FIG. 7F. In an embodiment, the second PNF pattern 754*b* may be a frame like spatial distribution of actinic radiation as illustrated by the dark gray region in FIGS. 7G-H. The nanoimprint lithography system 100 may include one or more optical components for generating and guiding the frame like spatial distribution through the template, while the template is in an offset location, so as to provide a PNF of actinic radiation to a perimeter region of the imprint field. The frame like spatial distribution of actinic radiation passes through the recessed surface 244, the shaping surface 112, and the mesa sidewalls 246. The offset location and the shape of the frame like spatial distribution are configured to pass only a limited amount of actinic radiation through the mesa sidewalls 246.

In an embodiment, the optical system includes a spatial light modulator (for example: DMD; LCD; LCoS, etc.) that is used to direct actinic radiation to the imprinted formable material so as to continue curing those RLT and patterned regions near the edges of the imprint field where the PNF from first curing step S608*a* has been reduced so as to prevent curing of the formable material that has attached itself to the mesa sidewalls 246. In an embodiment, a plurality of light sources are used to produce the frame like spatial distribution of actinic radiation. In an embodiment, a rectangular annulus light source or an annular light source is used to produce the frame like spatial distribution of actinic radiation.

In an embodiment, the offset location relative to the imprint field in combination with control of the spatial distribution of the actinic radiation can help prevent the buildup of extrusions on the mesa sidewall 246 from receiving additional actinic radiation while areas of soft cured formable material can be hard cured while only exposing a limited portion of the mesa sidewall to actinic radiation.

In an embodiment, a lower PNF of actinic radiation may be used for a perimeter portion 748*b* of the imprint field during step S608*a*. This may be accomplished by adjusting an aperture and/or using a spatial light modulator to adjust the output of the actinic radiation source. In an embodiment, the PNF of actinic radiation received by the perimeter region is only enough to form the features near the imprint edges and to prevent separation induced defects (pillar distortion, template plug, etc.) and is not enough to completely cure the formable material (soft cure). This configuration allows for the minimization of the amount radiation that is received by extrusions.

After both the separation step S310 and the translation step S614, edges, marks, and/or features of the imprint field that need additional curing can receive an additional PNF of actinic radiation in the second curing step S608*b*. During the second curing step S608*b* most of the mesa sidewall is not exposed to the actinic radiation except at two subportions 746*a* of the mesa sidewall 246.

Figure 7G:
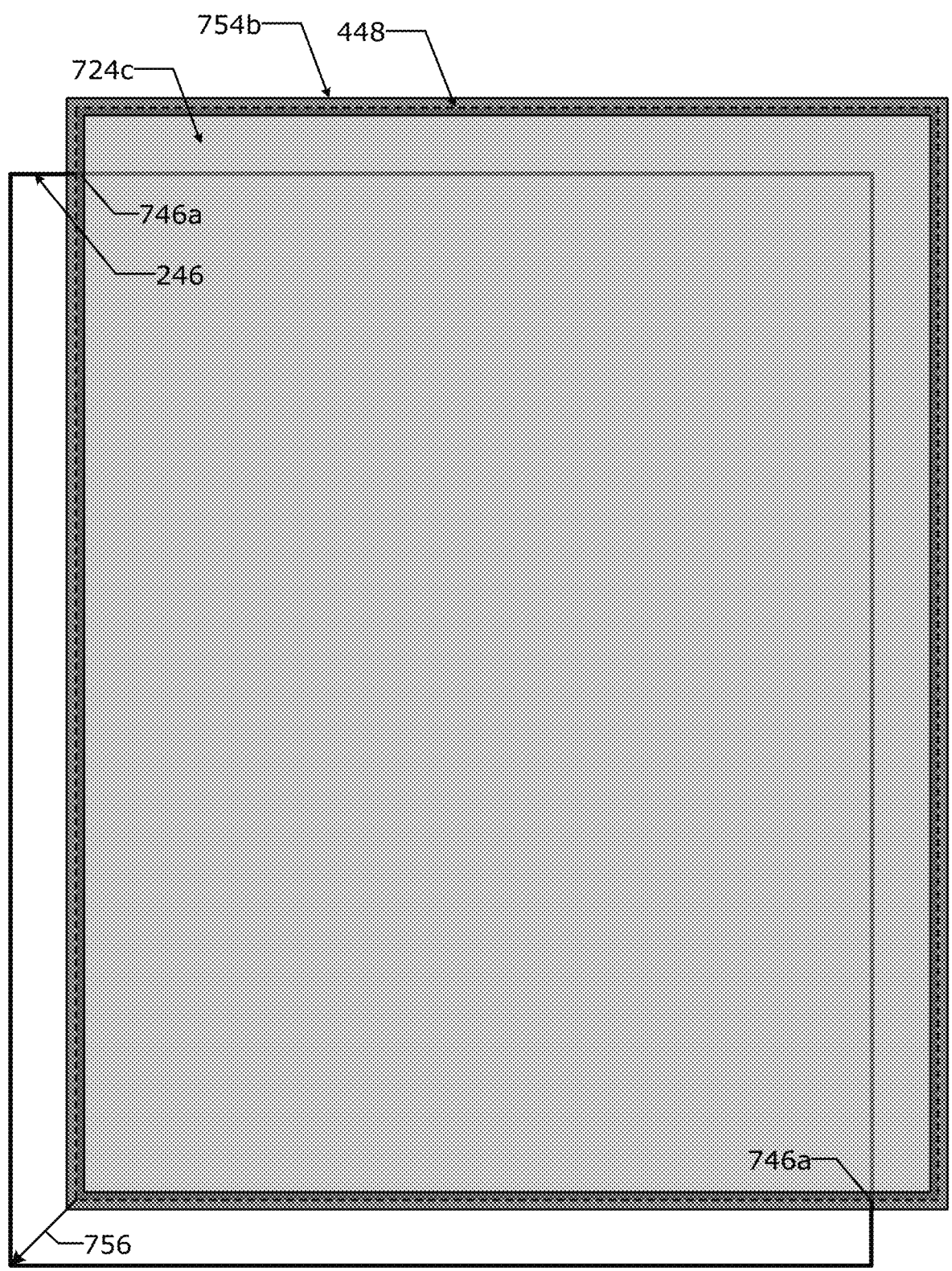
Figure 7H:
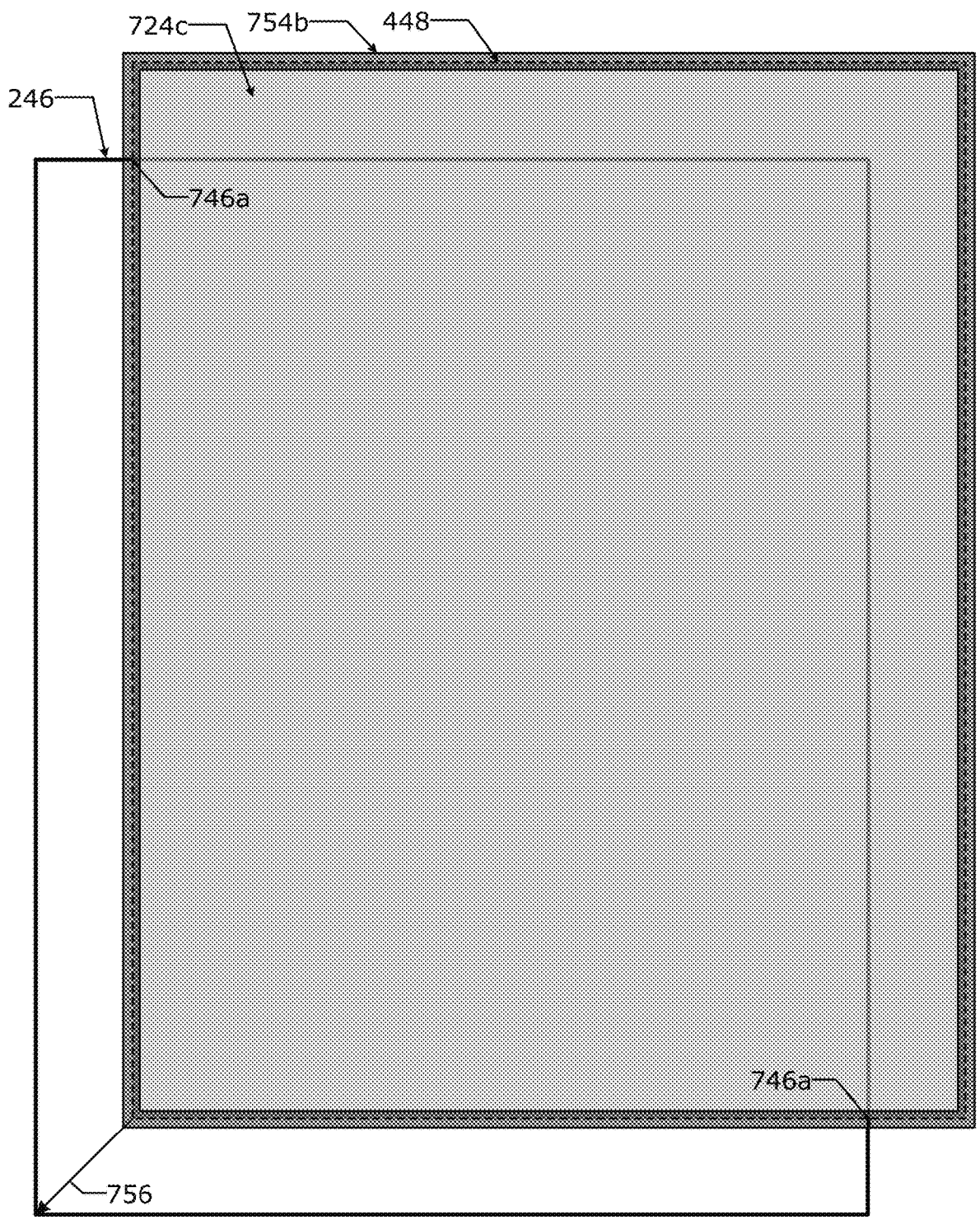
Figure 7I:
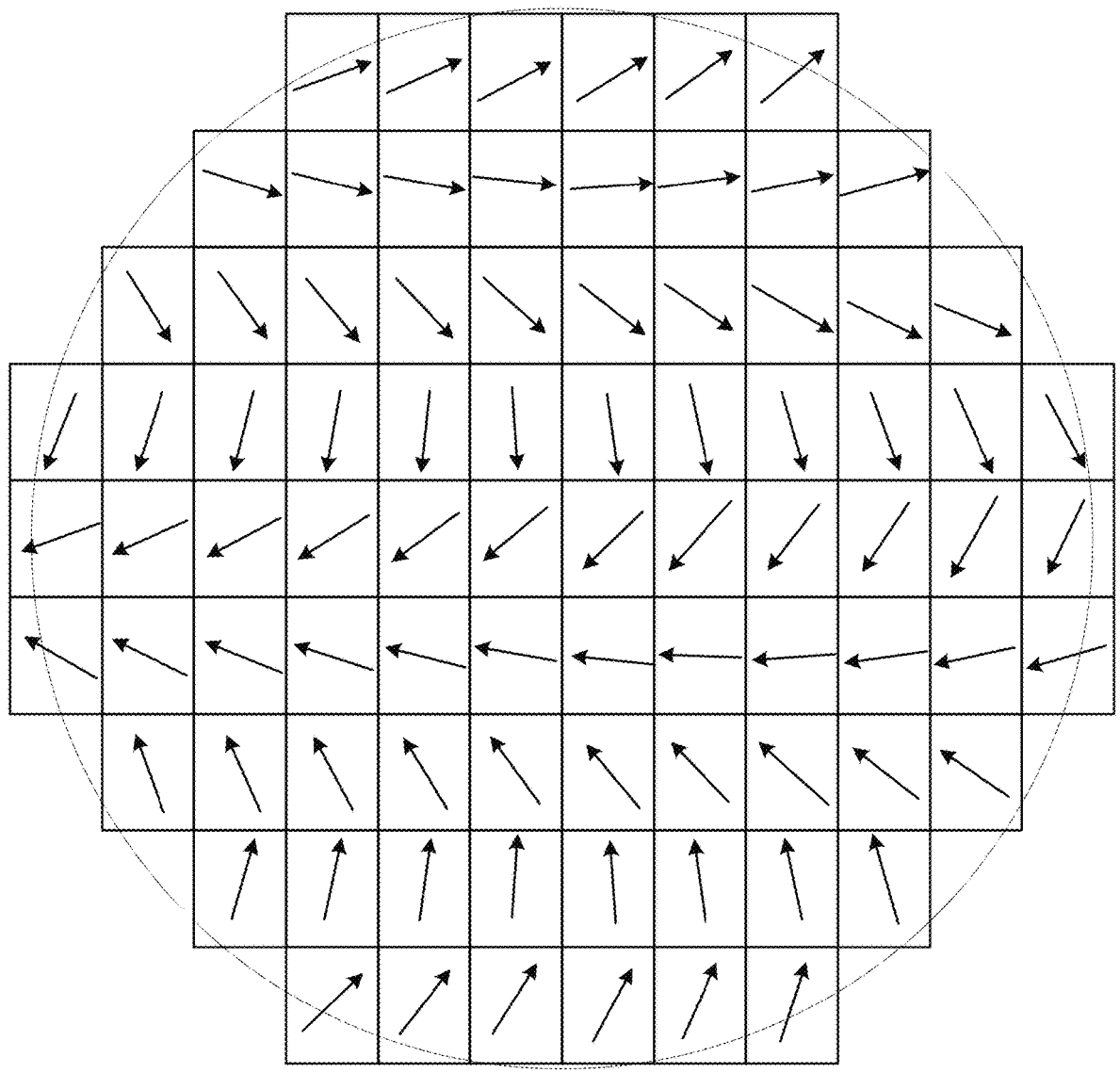

In an embodiment, during the translation step S614, the offset location for each imprint field is different. A vector quantity 756 may represent a relative difference between an imprint field and an offset location of the template projected onto a plane parallel to the imprint field. A set of these vector quantities may be formed from a vector quantity 756 for each imprint field in the set of imprint fields. The set of imprint fields are those imprint fields used prior to the mesa sidewalls 246 or the template 108 being cleaned or the template 108 being replaced. In an embodiment, all the vectors in the set of vectors are different from each other as illustrated in FIG. 7I. In an embodiment, all the vectors in the set of vectors have different directions and magnitudes such that different subportions 746*a* are illuminated with actinic radiation during the second curing step S608*b*. In an embodiment, that number of distinct vectors is between 2 and 100. Thus, in an embodiment, during the translation step S614 the template 108 is moved to different offset locations between imprinting fields to reduce repeated exposures at the same subportions 746*a*. In an embodiment, magnitudes of the vector quantities are less than the size of an imprint field. In an embodiment, magnitudes of the vector quantities are less than 2 mm, 5 mm, or 50 μm.

A first imprint field on a substrate may be shaped using shaping process 600. During the translation step S614, a first vector quantity 756 may represent the relative position of the first imprint field and a first offset location as illustrated in FIG. 7G. During step S608*b*, a first set of two subportions 746*s* of the mesa sidewall are exposed to actinic radiation. The shaping process 600 then repeats for a second imprint field, in which a second vector quantity 756 may represent the relative position of the second imprint field and a second offset location as illustrated in FIG. 7H. Also, during step S608*b*, a second set of two subportions 746*a* of the mesa sidewall 246 are exposed to actinic radiation. The first vector quantity 756 is different than the second vector quantity 756, such the first set of two subportions 746*a* is different from the second set of two subportions 746*a*. Formable material on the mesa sidewalls that is only soft cured will shrink and also evaporate much more than formable material on the mesa sidewalls that is hard cured. The consequence of this is that buildup of extrusions on the mesa sidewalls 246 is slowed down.

In an embodiment, the vector quantity has a magnitude that is between 0.1-10 mm. In an embodiment, the shaping process 600 is performed for each imprint field. In an alternative embodiment, the shaping process 600 is only performed for a subset (50% to 30%) of the imprint fields and in other imprint fields imprinting process 300 is used. In an embodiment, some areas of neighboring imprint fields received some actinic radiation during step S608*b*.

Figure 8A:
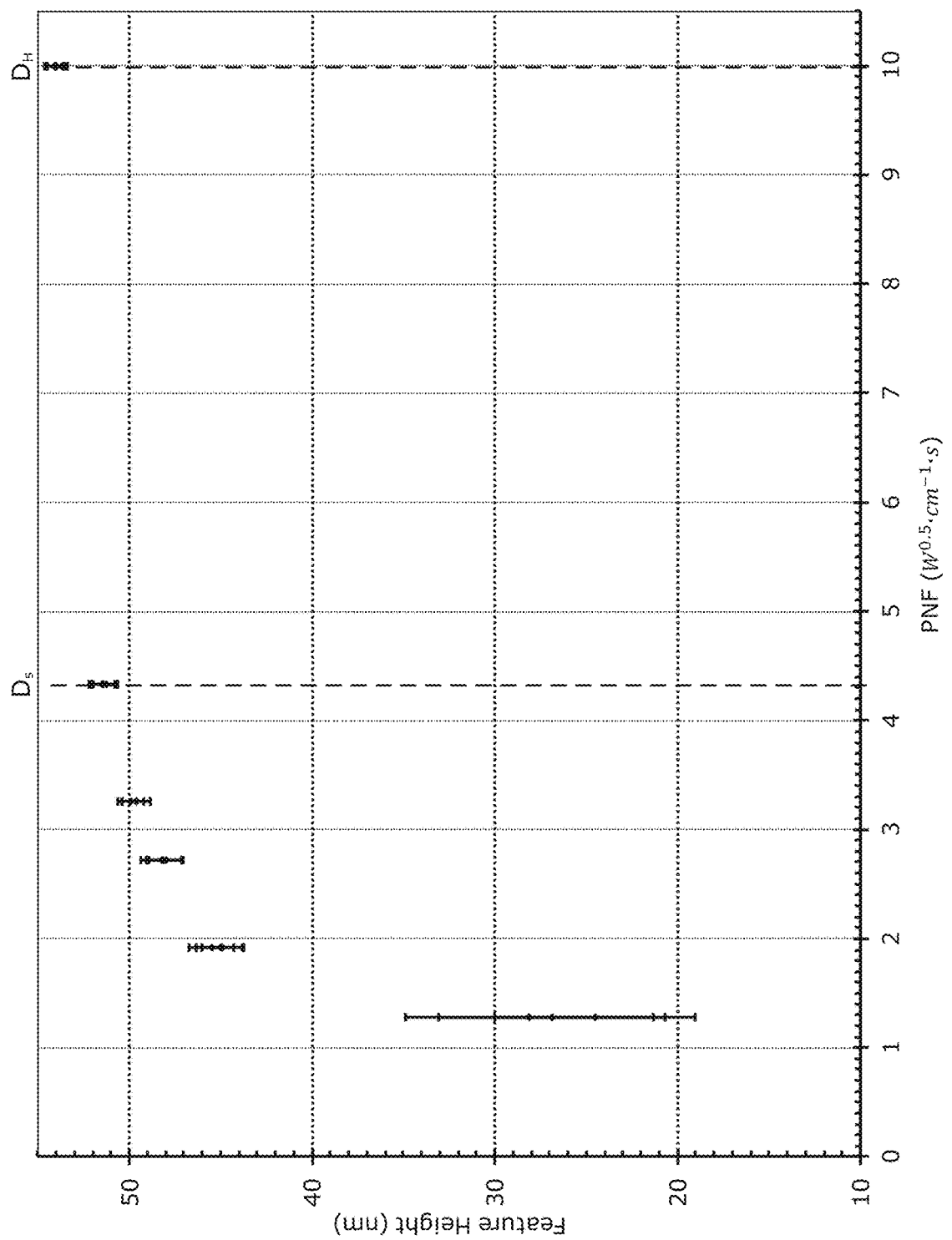
FIG. 8A is an illustration of information about feature height vs PNF as used in an embodiment.
Figure 8B:
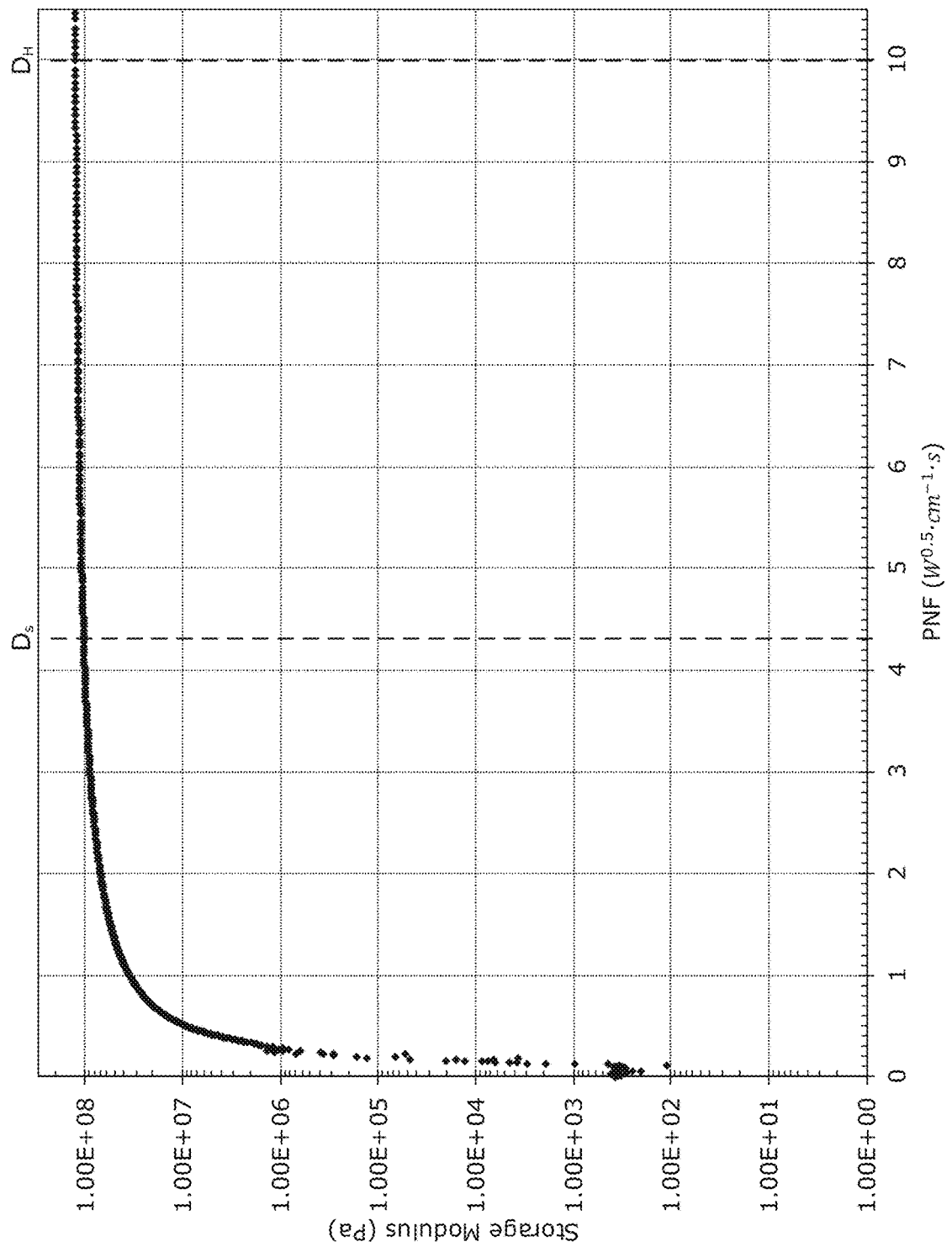
FIG. 8B is an illustration of information about storage modulus vs PNF as used in an embodiment.

In an embodiment, the perimeter portion 748*b* of the imprint field is soft cured with the first PNF pattern 754*a* during the first curing step S608*a*. The PNF of the first PNF pattern 745*a* in the perimeter portion 748*b* is between a soft cure PNF threshold $D_S$ 758*b* and a hard cure PNF threshold $D_H$ 758*a*. In an embodiment, a PNF of the first PNF pattern 745*a* on the mesa sidewalls 246 is equal to or below the soft cure PNF threshold $D_S$ 758*b*. In an embodiment, the soft cure PNF threshold $D_S$ 758*b* is determined based on measuring the height of the imprinted features which have been imprinted with a plurality of PNFs. FIG. 8A is an illustration showing how the height $FH_M$ of multiple features formed with a nanoimprint template varies based on the PNF. Heights $FH_M$ of a plurality features were measured with an atomic force microscope one day after the fields were imprinted with a plurality of PNFs. When the template 108 initially separates from the cured film, the cured film has features with a feature height $FH_I$ that is substantially independent of the PNF. After one day these features have shrunk by an amount that varies depending on the PNF as illustrated in FIG. 8A. The applicant has found that when a PNF (soft cure PNF threshold 758b) that produces a shrinkage that is 11-20% after 1 day, then a soft cured film separates well from the template and produces minimal defects. In order to improve the etch performance and stability the soft cured film may then be exposed to additional actinic radiation until at least the features in the soft cured film are hard cured. The applicant has found that when a PNF (hard cure PNF threshold 758a) that produces a shrinkage that is 5-10% after 1 day, then a hard cured film has good etch performance and stability. The applicant has found that other material properties (storage modulus, elastic modulus, shrinkage after 10 minutes of being cured, elastic modulus after 10 minutes of being cured, etch performance, etc.) of the soft cured films and hard cured films may also be used to determine the hard cure PNF threshold 758a and the soft cure PNF threshold 758b. FIG. 8B is an illustration of how the storage modulus varies with PNF. The storage modulus may be measured using for example a dynamic viscoelasticity measurement apparatus. One or more of these mechanical properties of the imprinted film can be correlated with defect performance as a function of PNF. The defect performance can be separated into those associated with the separation and those associated with shrinkage and evaporation. The soft cure PNF threshold may then be determined based on the PNF which reduces defects due to separation while the hard cure PNF threshold may be determined based on the minimum storage modulus that meets etch performance and stability requirements. The hard cure PNF threshold and the soft cure PNF threshold may be based on the ability of the final shaped film to meet multiple mechanical specifications all of which may be measured as a function of PNF.

In an embodiment, a first distribution of wavelengths ($\lambda$) of actinic radiation $PNF_1(\lambda)$ are used in the first curing step S608a and a second distribution of wavelengths ($\lambda$) of actinic radiation $PNF_2(\lambda)$ are used in the second curing step S608b. In an embodiment, a wavelength dependent weighting function $W(\lambda)$ is determined which describes the ability of the formable material to be cured by particular wavelengths. An effective $PNF_e$ may then be determined based on the weighted sum of $PNF_2(\lambda)$ and $PNF_1(\lambda)$ that is integrated over the wavelengths ($\lambda$).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of shaping a film on a substrate, the method comprising the steps of:

(a) contacting formable material in a first imprint field on the substrate with a shaping surface of a template;
       wherein outer boundaries of the first imprint field correspond to outer boundaries of the shaping surface while the shaping surface is in contact with the formable material;
    (b) forming with actinic radiation a cured layer within the first imprint field while the shaping surface is in contact with the formable material by curing a first portion of the formable material;
    (c) separating the shaping surface from the cured layer;
    (d) moving the template away from the first imprint field to a first offset location at which the shaping surface is spaced from the crown surface of the cured layer and the outer boundaries of the shaping surface are offset relative to the outer boundaries of the first imprint field; and
    (e) curing, with actinic radiation passing through two or more of the shaping surface, mesa sidewalls of the template, and a recessed surface of the template, a second portion of the formable material while the template is at the first offset location so as to form the shaped film.

2. A method of manufacturing articles including the use of the method of shaping the film as recited in claim 1, the method of manufacturing articles comprising:
    processing the substrate on which the shaped film is produced.

3. The method of shaping a film according to claim 1, further comprising:
    repeating steps (a)-(e) at a second imprint field;
    wherein during repeated steps (d-e) the template is at a second offset location instead of the first offset location;
    wherein a first vector quantity represents a relative difference between the first imprint field and the first offset location, projected onto a plane parallel to the imprint field;
    wherein a second vector quantity represents a relative difference between the second imprint field and the second offset location, projected onto a plane parallel to the imprint field; and
    wherein the first vector quantity is different from the second vector quantity.

4. The method of shaping a film according to claim 1, further comprising:
    repeating steps (a)-(e) for each imprint field among a plurality of imprint fields on the substrate;
    wherein during repeated steps (d-e) the template is at a different offset location for each of the respective imprint fields;
    wherein there is a set of vector quantities, wherein each vector quantity in the set of vector quantities represents a relative difference between a respective one of the imprint fields and its respective offset location associated therewith, projected onto a plane parallel to the imprint field; and
    wherein there are at least two different vector quantities in the set of vector quantities.

5. The method of shaping a film according to claim 4, wherein all the vector quantities in the set of vector quantities are different from each other.

6. The method of shaping a film according to claim 4, wherein magnitudes of the vector quantities in the set of vector quantities are less than a diagonal size of the imprint field.

7. The method of shaping a film according to claim 4, wherein magnitudes of the vector quantities in the set of vector quantities are less than 2 mm.

8. The method of shaping a film according to claim 1, wherein the cured layer is formed in step (b) by exposing the first portion of the formable material to the actinic radiation while the template is in contact with the formable material.

9. The method of shaping a film according to claim 8, wherein a PNF of the actinic radiation incident on a perimeter portion of the formable material at the outer boundaries of the first imprint field is less than a hard cure PNF threshold of the formable material and greater than a soft cure PNF threshold of the formable material.

10. The method of shaping a film according to claim 9, wherein a central portion of the formable material in the first imprint field is cured with a PNF of the actinic radiation above the hard cure PNF threshold and has a shrinkage of less than 10%; and wherein formable material in the first imprint field that has been cured with a PNF that is between the hard cure PNF threshold and the soft cure PNF threshold has a shrinkage of between 11-20%.

11. The method of shaping a film according to claim 9, wherein a central PNF of the actinic radiation incident on the formable material in a central portion of the first imprint field is greater than the hard cure PNF threshold of the formable material.

12. The method of shaping a film according to claim 1, wherein curing the second portion of the formable material in step (e) is performed by exposing the second portion of the formable material to the actinic radiation while the template is not in contact with the formable material.

13. The method of shaping a film according to claim 12, wherein all or a portion of the actinic radiation that exposes the second portion of the formable material in step (e) passes through two or more of: the shaping surface of the template; mesa sidewalls of the template; and a recessed surface of the template.

14. The method of shaping a film according to claim 12, wherein a PNF in step (e) of the actinic radiation incident on a perimeter portion of the formable material at the outer boundaries of the first imprint field is less than a PNF incident on a central portion of the formable material.

15. The method of shaping a film according to claim 12, wherein a total PNF from steps (b) and (e) of the actinic radiation incident on a perimeter portion of the formable material at the outer boundaries of the first imprint field is greater than or equal to a hard cure PNF threshold of the formable material.

16. The method of shaping a film according to claim 1, wherein:
the cured layer is formed in step (b) by exposing the first portion of the formable material to a first wavelength distribution of actinic radiation while the template is in contact with the formable material;
wherein curing the second portion of the formable material in step (e) is performed by exposing the second portion of the formable material to a second wavelength distribution of actinic radiation while the template is not in contact with the formable material; and
wherein the first wavelength distribution is different from the second wavelength distribution of actinic radiation.

17. The method of shaping a film according to claim 16, wherein an effective PNF from steps (b) and (e) of the actinic radiation incident on a perimeter portion of the formable material at the outer boundaries of the first imprint field is greater than or equal to a hard cure PNF threshold of the formable material.

18. The method of shaping a film according to claim 1, wherein the shaping surface is planar.

* * * * *